(12) United States Patent
Nimura et al.

(10) Patent No.: US 8,422,246 B2
(45) Date of Patent: Apr. 16, 2013

(54) ELECTRONIC APPARATUS

(75) Inventors: Wataru Nimura, Hamura (JP); Kenzo Ichikawa, Kokubunji (JP)

(73) Assignee: Casio Computer Co., Ltd., Tokyo (JP)

( * ) Notice: Subject to any disclaimer, the term of this patent is extended or adjusted under 35 U.S.C. 154(b) by 234 days.

(21) Appl. No.: 12/881,316

(22) Filed: Sep. 14, 2010

(65) Prior Publication Data

US 2011/0063814 A1 Mar. 17, 2011

(30) Foreign Application Priority Data

Sep. 14, 2009 (JP) .................................. 2009-211233
Sep. 15, 2009 (JP) .................................. 2009-213323
Jul. 15, 2010 (JP) .................................. 2010-160172

(51) Int. Cl.
*H05K 7/14* (2006.01)

(52) U.S. Cl.
USPC ............................. 361/796; 361/816; 361/799

(58) Field of Classification Search .......... 361/728–730, 361/799, 816, 818, 796, 790, 800, 679; 174/520, 174/51, 35 R
See application file for complete search history.

(56) References Cited

U.S. PATENT DOCUMENTS

| | | | | |
|---|---|---|---|---|
| 6,348,862 B1 * | 2/2002 | McDonnell et al. | .......... | 340/562 |
| 6,373,716 B1 * | 4/2002 | Muramatsu | ................... | 361/784 |
| 6,724,324 B1 * | 4/2004 | Lambert | ........................ | 341/33 |
| 7,167,689 B2 | 1/2007 | Martin et al. | | |
| 7,247,791 B2 * | 7/2007 | Kulpa | .............................. | 174/50 |
| 8,144,482 B2 * | 3/2012 | Sato et al. | ...................... | 361/794 |
| 2007/0211483 A1 | 9/2007 | Ando et al. | | |

FOREIGN PATENT DOCUMENTS

| | | |
|---|---|---|
| JP | 07-029467 A | 1/1995 |
| JP | 11-39093 A | 2/1999 |
| JP | 11-40906 A | 2/1999 |
| JP | 2000-208981 A | 7/2000 |
| JP | 2001-272486 A | 10/2001 |
| JP | 2002-111469 A | 4/2002 |
| JP | 2005-31790 A | 2/2005 |
| JP | 2007-55551 A | 3/2007 |
| JP | 2007-170994 A | 7/2007 |
| JP | 2007-170995 A | 7/2007 |
| JP | 2007-230450 A | 9/2007 |

OTHER PUBLICATIONS

Japanese Office Action dated Sep. 13, 2011 (and English translation thereof) in counterpart Japanese Application No. 2010-160172.

* cited by examiner

*Primary Examiner* — Hung S Bui

(74) *Attorney, Agent, or Firm* — Holtz, Holtz, Goodman & Chick, P.C.

(57) ABSTRACT

An electronic apparatus includes a front case, a rear case whose peripheral portion is brought into engagement with a peripheral portion of the front case and an electrostatic capacity type sensor portion which is encompassed by the front case and the rear case. A primary conductive portion, which is brought into engagement with the sensor portion for electrical connection, is formed on part of an inner surface of the peripheral portion of one of the cases which extends to the engagement portion. By adopting this configuration, the electronic apparatus can be fabricated easily and the operation of a touch switch provided in the electronic apparatus can be stabilized.

5 Claims, 17 Drawing Sheets

ELECTRONIC APPARATUS

CROSS-REFERENCE TO RELATED APPLICATIONS

This application is based upon and claims the benefit of priority under 35 USC 119 of Japanese Patent Application No. 2009-211233 filed on Sep. 14, 2009, Japanese Patent Application No. 2009-213323 filed on Sep. 15, 2009, and Japanese Patent Application No. 2010-160172 filed on Jul. 15, 2010, the entire disclosure of which, including the description, claims, drawings and abstract thereof, is incorporated herein by reference.

BACKGROUND OF THE INVENTION

1. Field of the Invention

The present invention relates to an electronic apparatus and more particularly to an electronic apparatus having an electrostatic capacity type touch switch.

2. Description of the Related Art

Conventionally, in electronic apparatuses such as lighting systems, there are known electronic apparatuses which incorporate touch switches (for example, Japanese Unexamined Patent Publication No. 2007-55551). In such electronic apparatuses, electrostatic capacity type touch switches are also provided in a peripheral portion of an electronic apparatus so as to detect a touch thereon. For example, FIG. 17 is an explanatory diagram showing a schematic configuration of a conventional electronic apparatus 100. An upper diagram shows a perspective view which depicts an overall configuration of the electronic apparatus 100, an intermediate diagram shows a perspective view which depicts a front case 101 of the electronic apparatus 100, and a lower diagram shows a perspective view which depicts a rear case 102 and a substrate 103 of the electronic apparatus 100. In addition, FIG. 18 is a sectional view taken along the line XII-XII in FIG. 17, and FIG. 19 is a sectional view taken along the line XIII-XIII in FIG. 17.

The electronic apparatus 100 shown in FIG. 17 has a front case 101, a rear case 102 and a substrate 103 which is encompassed in these cases 101, 102. A touch switch 200 having flexible substrates 201 is mounted on one edge portion of the substrate 103. Touch switches 300 each having sensor portions 301 which are placed directly on the substrate 103 are mounted individually on the remaining three edge portions of the substrate 103.

For example, in the case of the touch switch 200 shown in FIG. 18, the flexible substrate 201 is connected to a connector 203 provided on a rear surface of the substrate 103. Then, the flexible substrate 201 is curved from the one edge portion side towards a front surface side of the substrate 103 to be brought into contact with the front case 101. A sensor portion 202 of the touch switch 200 is provided at the contact portion between the portion of the flexible substrate 201 and the front case 101. By doing so, when the one edge portion of the front case 101 where the touch switch 200 is provided is touched by the finger or the like, the sensor portion 202 reads a change in electrostatic capacity and detects that the touch switch 200 has been touched.

In addition, in the case of the touch switch 300 shown in FIG. 19, the sensor portions 301 placed on the front surface of the substrate 103 are pressed by a projecting portion 302 provided on an inside of the front case 101. By doing so, when any of the three edge portions of the front case 101 where the touch switches 300 are provided is touched by the finger or the like, the sensor portion 301 reads a change in electrostatic capacity via the projecting portion 302 and detects that the touch switch 300 has been touched.

Incidentally, in the case of the touch switch 200 utilizing the flexible substrates 201, in the event that the electronic apparatus is made smaller in size or in the event that inner surfaces of lateral end portions or lateral end corner portions of the front case 101 are formed orthogonal or a boss or a rib is formed on the inner surfaces, it is difficult to bend the flexible substrate 201 so that the sensor portion 202 is affixed to the front case 101 at the time of assemblage of the electronic apparatus 100.

In addition, in the case of the touch switch 300 having the sensor portions 301 which are placed directly on the substrate 103, although the touch switch 300 is more advantageous than the touch switch 200 which utilizes the flexible substrates 201 in terms of suppressing the production costs, the lateral end portions of the front case 101 do not face the sensor portions 301, and moreover, a large air layer 303 is interposed between the lateral end portions and the sensor portions 301. Therefore, what is actually occurring at the lateral end portions of the front case 101 is a remarkable reduction in sensitivity.

Additionally, in the event of an electrostatic capacity type sensor being used as a touch switch, a non-conductive material such as a resin is generally used as a material for a case of an electronic apparatus.

In the event of a resin being used as a material for the case, compared with a case where a metallic material is used for the case, static electricity is generated and easily enters the interior of the electronic apparatus. As this occurs, static electricity is applied to electronic components residing in the interior of the electronic apparatus, leading to a fear that the electronic apparatus malfunctions or is damaged.

Further, in the event of the resin being used as the material of the case, a shield layer has had to be provided to prevent the emission of unnecessary radiation noise to an outside of the electronic apparatus which is emitted from a high-frequency circuit portion which resides in the interior of the electronic apparatus.

SUMMARY OF THE INVENTION

The invention has been made in view of the problems inherent in the related art.

According to a first aspect of the invention, there is provided an electronic apparatus comprising a front case, a rear case whose peripheral portion is brought into engagement with a peripheral portion of the front case, and an electrostatic capacity type sensor portion which is encompassed by the front case and the rear case, wherein a primary conductive portion is formed on part of an inner surface of the peripheral portion of one of the cases of the front case and the rear case which extends as far as the engagement portion, the primary conductive film being energized by being brought into abutment with the sensor portion.

According to a second aspect of the invention, there is provided an electronic apparatus comprising a front case, a rear case whose peripheral portion faces with a peripheral portion of the front case, an electrostatic capacity type sensor portion which is encompassed by the front case and the rear case, and an interposed member which is held between the peripheral portion of the front case and the peripheral portion of the rear case along the full circumference thereof and which is brought into abutment with the sensor portion, wherein an interposed member conductive portion is formed from a portion which is in abutment with the sensor portion to a portion on a front surface of the interposed member which corresponds to a position where the peripheral portion of the front case and the peripheral portion of the rear case face each other.

BRIEF DESCRIPTION OF THE DRAWINGS

The invention will be understood more sufficiently by referring to the following detailed description of the invention and accompanying drawings. However, the detailed description of the invention and the accompanying drawings are given for clarity of the invention and do not limit the scope of the invention in any way. In those drawings.

DETAILED DESCRIPTION OF THE PREFERRED EMBODIMENTS

Hereinafter, a best mode for carrying out of the invention will be described by use of the drawings. However, although various technical limitations which are preferred to carry out the invention are given to the embodiments which will be described below, the scope of the invention is not limited to the following embodiments and illustrated examples in any way.

First Embodiment

Figure 1:
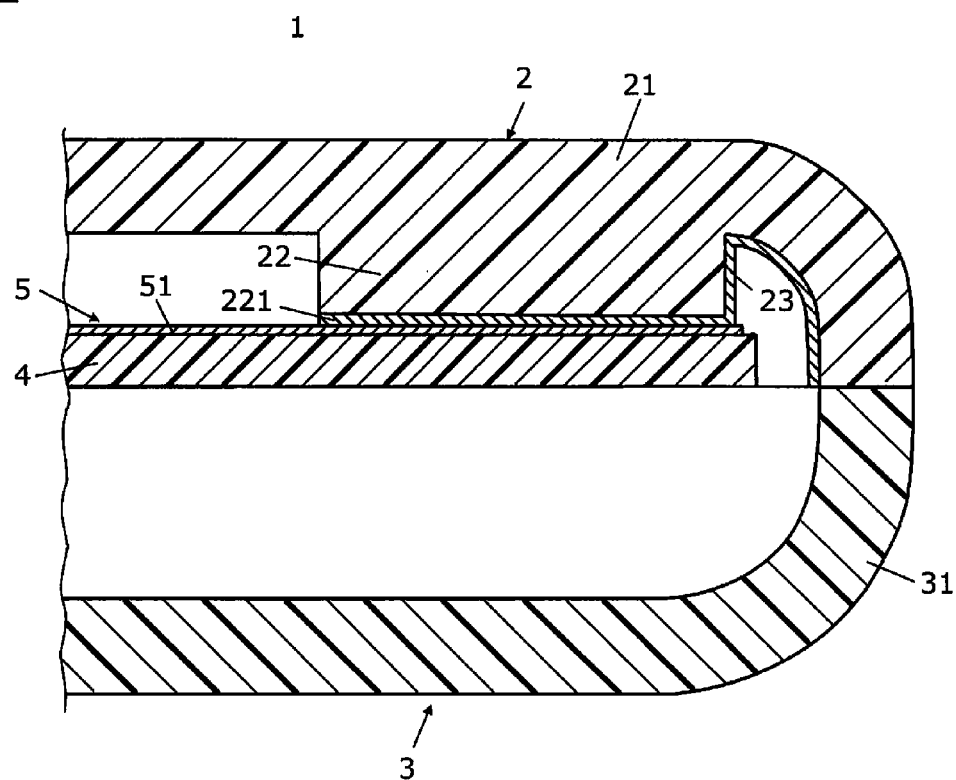
FIG. 1 is a sectional view depicting the configuration of a main part of an electronic apparatus according to a first embodiment of the invention.
Figure 17:
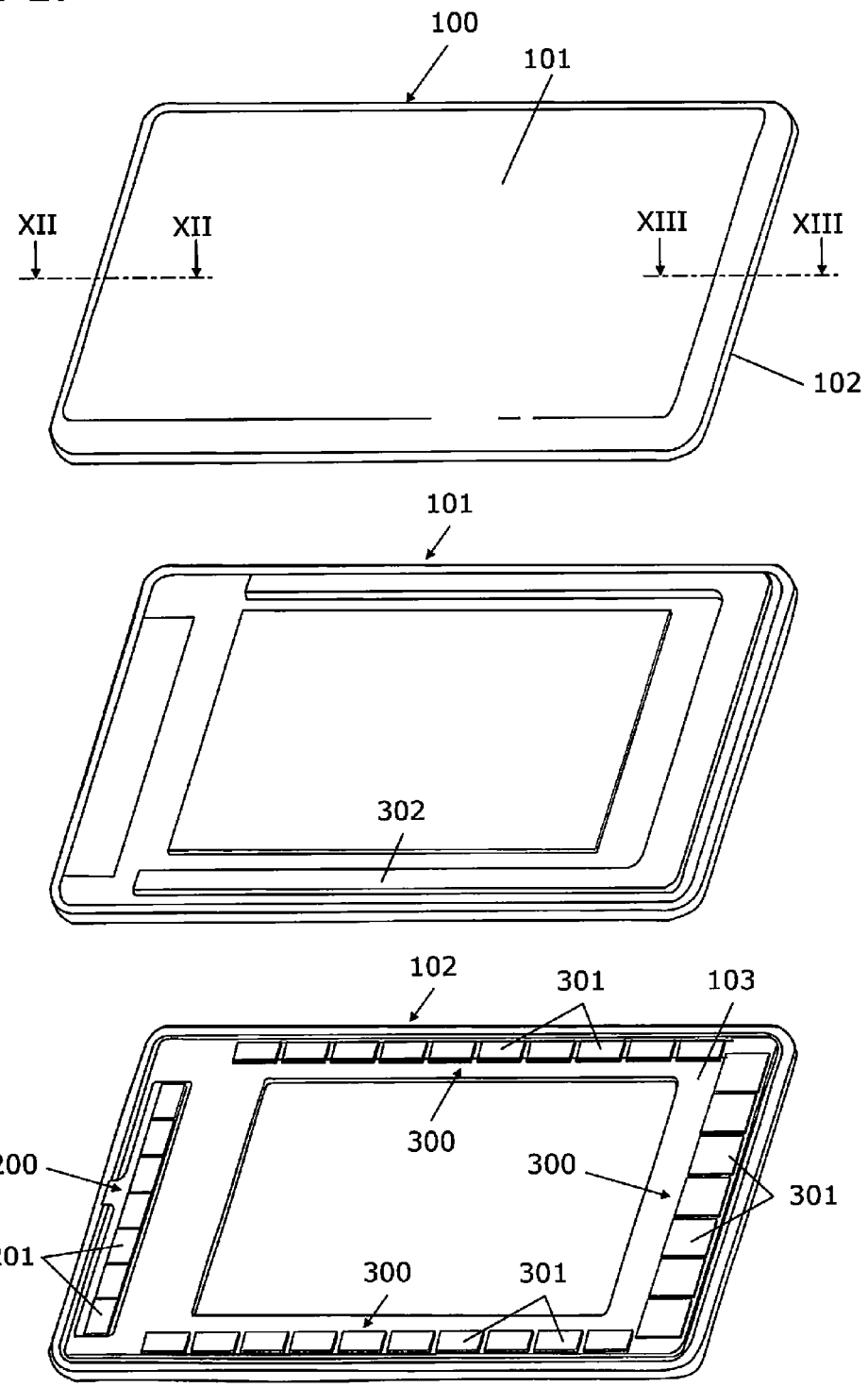
FIG. 17 is an explanatory diagram depicting the configuration of a main part of a conventional electronic apparatus.
Figure 18:
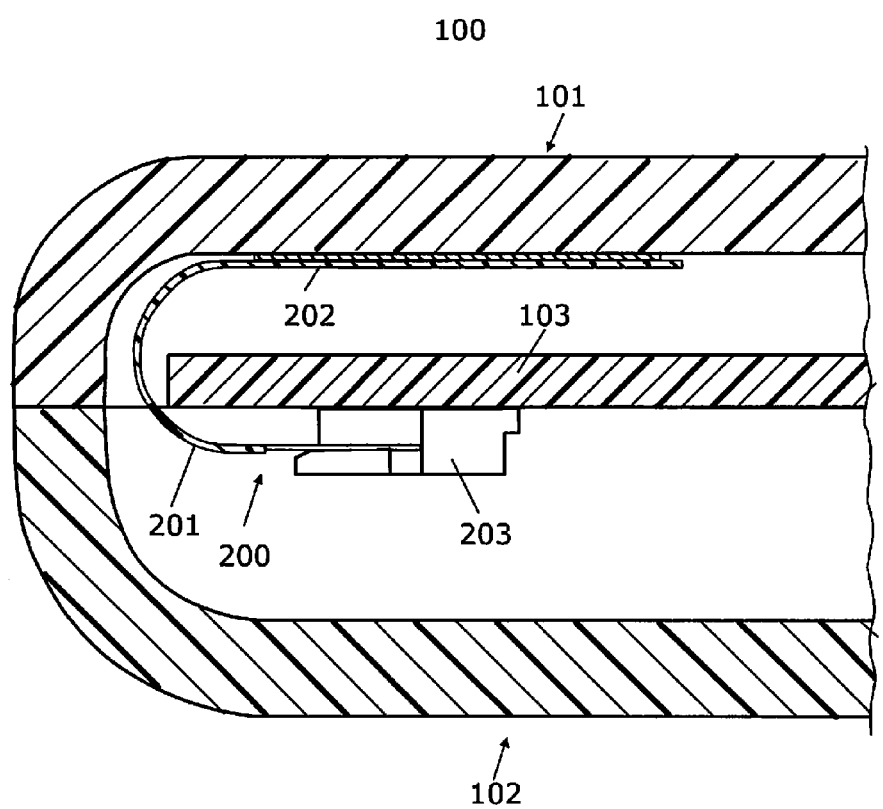
FIG. 18 is a sectional view taken along the line XII-XII shown in FIG. 17.
Figure 19:
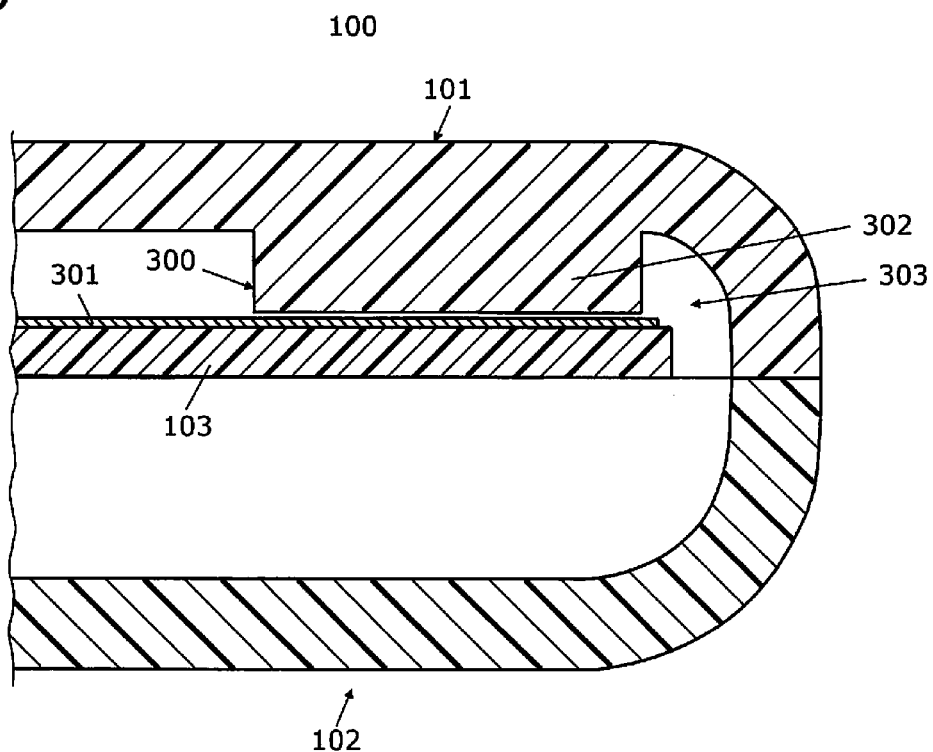
FIG. 19 is a sectional view taken along the line XIII-XIII shown in FIG. 17.

FIG. 1 is a sectional view depicting a schematic configuration of an electronic apparatus according to a first embodiment. Note that an overall configuration of an electronic apparatus 1 is almost the same as that of the conventional electronic apparatus 100 shown in FIG. 17, and hence, in the first embodiment, portions of the electronic apparatus 1 which are specific to the invention will mainly be described.

An electronic apparatus 1 is lighting equipment. As is shown in FIG. 1, the electronic apparatus 1 has a front case 2, a rear case 3, a substrate 4, a sensor portion 5 and a light source, which is not shown.

The front case 2 is formed from a resin or the like and covers a front surface of the electronic apparatus 1 entirely. A peripheral portion 21 of the front case 2 is curved towards a rear surface side. A projecting portion 22, which projects towards the rear surface side, is formed further inwards than the peripheral portion 21 of the front case 2. A conductive film (a primary conductive portion) 23 is formed on an inner surface of the front case 2 from the peripheral portion 21 to a distal end face 221 of the projecting portion 22. By doing so, the conductive film 23 is formed on the inner surface of the front case 2 as far as an engagement portion at the peripheral portion 21 where the front case 2 is brought into engagement with the rear case 3. The conductive film 23 is formed by any of treatments including plating, metallizing, carbon printing and conductive film affixing treatments.

A central portion of the front case 2 is formed from a material having light transmitting properties or formed into a configuration which transmits light so that illumination light from the light source can be passed therethrough to the outside.

The rear case 3 is formed from a resin or the like and covers a rear surface of the electronic apparatus 1 entirely. A peripheral portion 31 of the rear case 3 is curved towards a front surface side so as to be brought into abutment and then engagement with the peripheral portion 21 of the front case 2.

The substrate 4 is a printed circuit board and is encompassed by the front case 2 and the rear case 3. Placed on this substrate 4 are the sensor portion 5 which is of an electrostatic capacity type, a control circuit (whose illustration is omitted) for performing various controls based on signals outputted from the sensor portion 5 and the light source (whose illustration is omitted) which is illuminated based on a control signal from the control circuit.

In the sensor portion 5, an electrode 51 is formed on a front surface of the substrate 4 in a position which faces the projecting portion 22. The electrode 51 of the sensor portion 5 is in abutment with the conductive film 23 which lies on the distal end face 221 of the projecting portion 22, whereby the electrode 51 and the conductive film 23 are electrically connected. Then, in the event that the peripheral portion 21 of the front case 2 is touched by part of the human body such as a finger or the like, a change in electrostatic capacity is transmitted to the electrode 51 via the conductive film 23, whereby the sensor portion 5 detects that the peripheral portion 21 of the front case 2 has been touched. Namely, the front case 2, the conductive film 23 and the sensor portion 5 configure a touch switch.

Thus, as has been described heretofore, according to the electronic apparatus 1 of the first embodiment, since the conductive film 23, which is in abutment with the electrode 51 for electrical connection, is formed on the inner surface of the front case 2 as far as the engagement portion at the peripheral portion 21 where the peripheral portion 21 of the front case 2 is brought into engagement with the peripheral portion 31 of the rear case 3, the electrode 51 and an inner surface of a lateral end portion of the front case 2 can be brought into contact with each other by the conductive film 23, thereby making it possible to enhance the sensitivity of the touch switch at the lateral end portion of the peripheral portion of the electronic apparatus 1.

In addition, since the necessity of affixing the sensor portion to the front case by curving the flexible substrate at the time of assemblage of the electronic apparatus, which is the case with the related art, is obviated, the assemblage itself can be facilitated.

In the event that a projecting length of the projecting portion 22 is set so that the projecting portion 22 of the front case 2 presses the substrate 4 towards the rear surface side after the assemblage, the contact between the conductive film 23 and the electrode 51 can be ensured further, thereby making it possible to stabilize the sensitivity of the touch switch.

In addition to this, a conductive rubber is disposed between the projecting portion 22 and the substrate 4 so that the conductive rubber is interposed at the electrically connecting portion between the conductive film 23 and the sensor portion 5, whereby the contact between the conductive film 23 and the electrode 51 can be ensured further, thereby making it possible to stabilize the sensitivity of the touch switch.

Second Embodiment

While in the first embodiment, the electronic apparatus 1 is described as being formed into the substantially rectangular shape as viewed from the front, in a second embodiment, an electronic apparatus 50 will be described as being formed into a substantially circular shape as viewed from the front.

Figure 2:
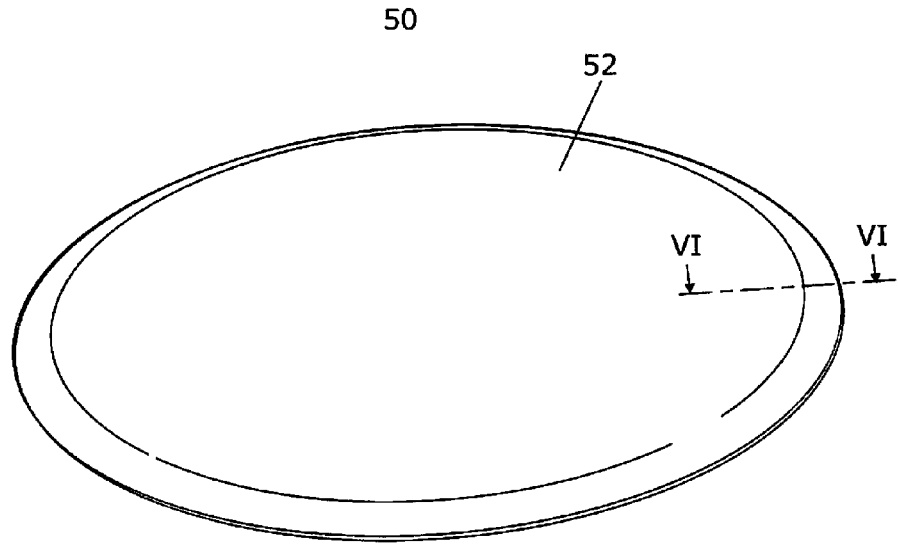
FIG. 2 is an external perspective view depicting an overall configuration of the electronic apparatus according to a second embodiment of the invention.
Figure 3:
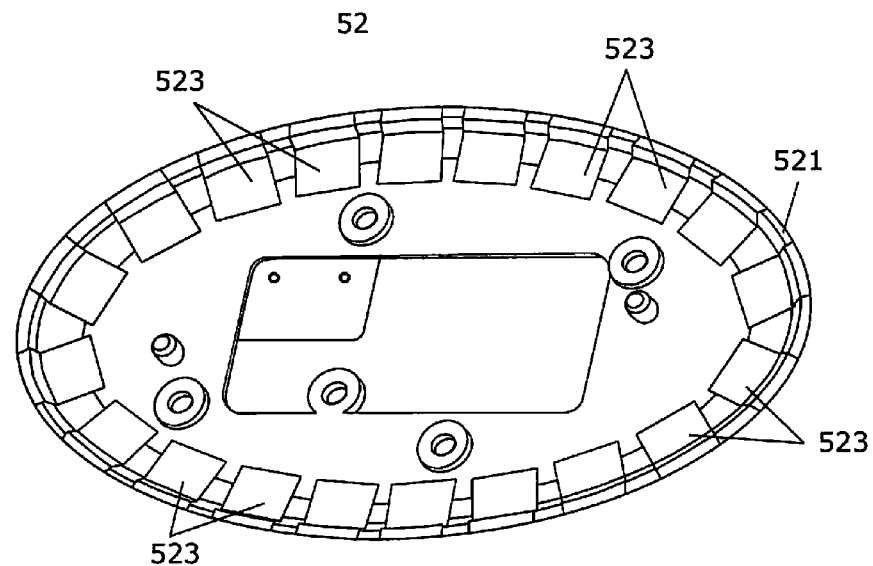
FIG. 3 is a perspective view depicting an internal construction of a front panel used in the electronic apparatus shown in FIG. 2.
Figure 4:
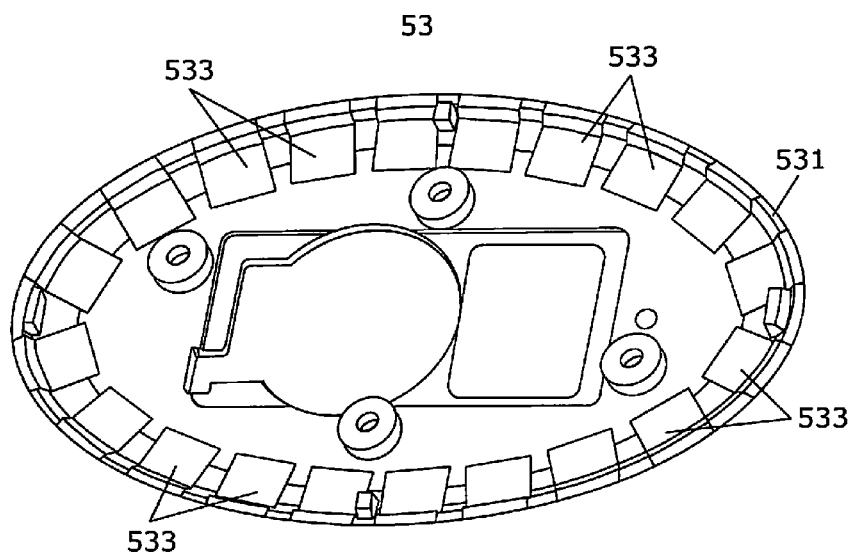
FIG. 4 is a perspective view depicting an internal construction of a rear panel used in the electronic apparatus shown in FIG. 2.
Figure 5:
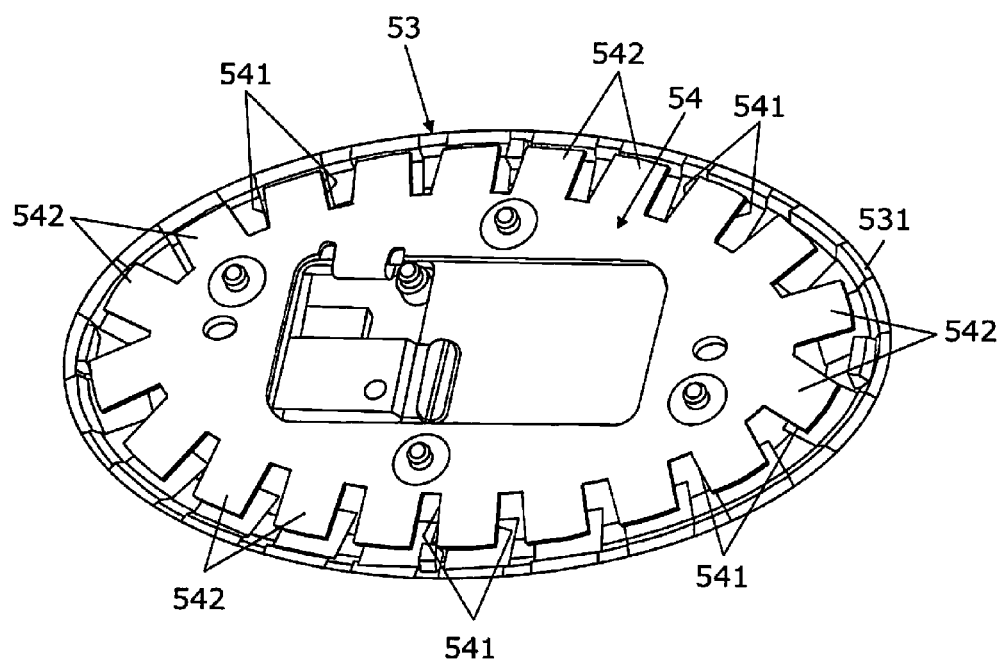
FIG. 5 is a perspective view depicting a positional relationship between the rear panel and a substrate which are used in the electronic apparatus shown in FIG. 2.
Figure 6:
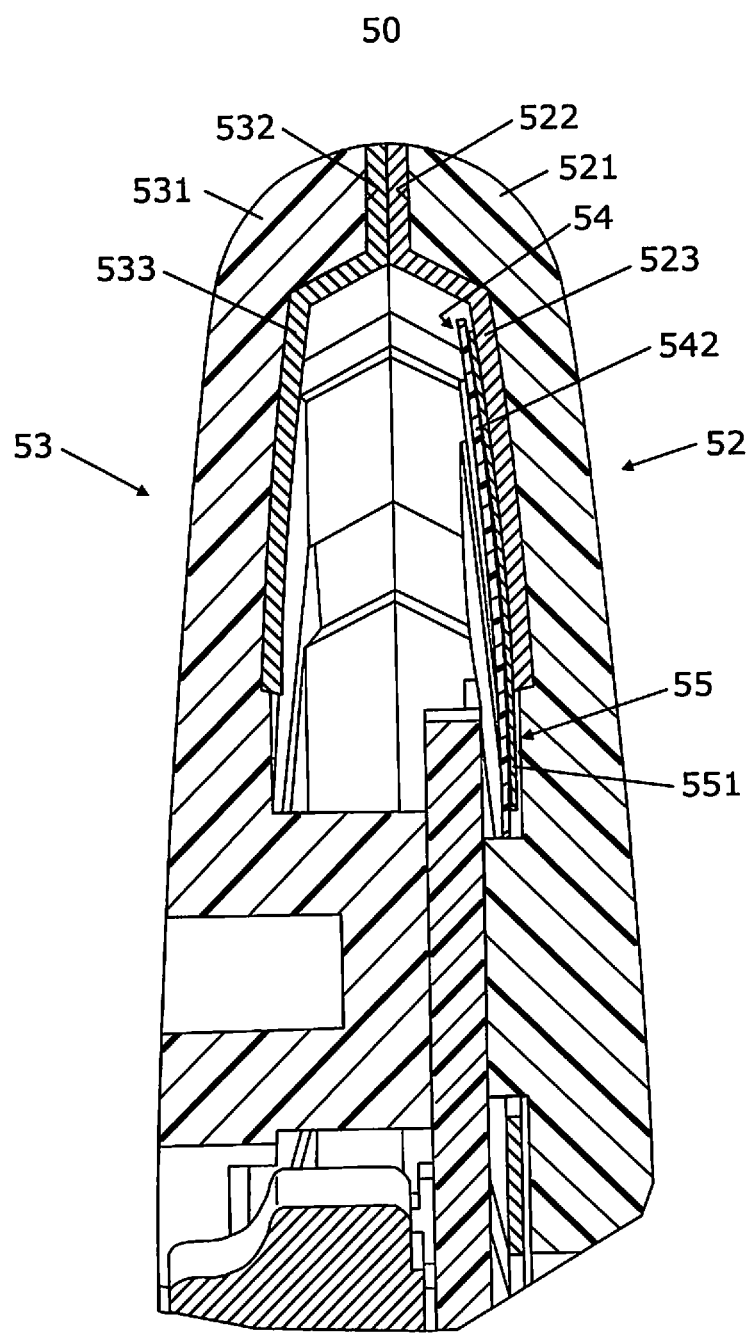
FIG. 6 is a sectional view taken along the line VI-VI in FIG. 2.

FIG. 2 is a perspective view depicting an overall configuration of an electronic apparatus 50 according to the second embodiment. FIG. 3 is a perspective view depicting an internal construction of a front case 52 included in the electronic apparatus 50. FIG. 4 is a perspective view depicting an internal construction of a rear case 53 included in the electronic apparatus 50. FIG. 5 is a perspective view depicting a positional relationship between the rear case 53 and a substrate 54 which are used in the electronic apparatus 50. FIG. 6 is a sectional view taken along the line VI-VI shown in FIG. 2.

As is shown in FIGS. 2 to 6, an electronic apparatus 50 has a front case 52, a rear case 53, a substrate 54, sensor portions 55, and a light source, which is not shown.

The front case 52 is formed from a resin or the like into a substantially disk shape and covers a front surface of the electronic apparatus 50 entirely. A peripheral portion 521 of the front case 52 is curved towards a rear surface side. A plurality of primary conductive films (primary conductive portions) 523 are arranged along a circumferential direction of the front case 52 on an inner surface side of the peripheral portion 521 of the front case 52. The plurality of primary conductive films 523 are arranged along the full circumference of the front case 52 at predetermined intervals. As is shown in FIG. 6, the primary conductive film 523 is formed from a portion where it is brought into abutment with an electrode 551 of the sensor portion to a distal end face 522 of the peripheral portion 521.

A central portion of the front case 52 is formed from a material having light transmitting properties or formed into a configuration which transmits light so that illumination light from the light source can be passed therethrough to the outside.

As is shown in FIGS. 4 to 6, the rear case 53 is formed from a resin or the like into a substantially disk shape and covers a rear surface of the electronic apparatus 50 entirely. A peripheral portion 531 of the rear case 53 is curved towards a front surface side so as to be brought into abutment and then engagement with the peripheral portion 521 of the front case 52. A plurality of secondary conductive films (secondary conductive portions) 533 are arranged along a circumferential direction of the rear case 53 on an inner surface side of the peripheral portion 531 of the rear case 53. The plurality of secondary conductive films 533 are arranged along the full circumference of the rear case 53 at a predetermined intervals so as to face the corresponding primary conductive films 523 of the front case 52. As is shown in FIG. 6, the secondary conductive film 533 is formed from a portion which faces the electrode 551 of the sensor portion 55 to a distal end face 532 of the peripheral portion 531. Namely, the secondary conductive film 533 is formed so as to face the corresponding primary conductive film 523 over the whole area thereof. Then, the primary conductive film 523 and the secondary conductive film 533 are interposed between the front case 52 and the rear case 53 in such a state that they are in abutment with each other at the abutment portion between the peripheral portion 521 of the front case 52 and the peripheral portion 531 of the rear case 531, that is, at the abutment portion between the distal end faces 522, 532. Therefore, the primary conductive film 523 and the secondary conductive film 533 are electrically connected together.

The primary conductive films 523 and the secondary conductive films 533 are formed by any of treatments including plating, metallizing, carbon printing and conductive film affixing treatments.

The substrate 54 is a flexible substrate and is encompassed by the front case 52 and the rear case 53 as is shown in FIGS. 5 and 6. Placed on the substrate 54 are the sensor portion 55, a control circuit (whose illustration is omitted) for performing various controls based on signals outputted at the sensor portion 55, the light source (whose illustration is omitted) adapted to be illuminated based on a control signal from the control circuit and the like. The substrate 54 has a substantially disk shape, and a plurality of slits 541 are formed along a circumference thereof. Extended portions 542 which extend radially between the slits 541 are provided so as to face the corresponding primary conductive films 523 of the front case 52.

The electrode 551 of the sensor portion 55 is formed on a front surface of each extended portion 542 of the substrate 54. As is shown in FIG. 6, the electrode 551 of the sensor portion 55 is in abutment with the primary conductive film 523 of the front case 52, whereby the electrode 551 and the primary conductive film 523 are electrically connected together. Then, when the peripheral portion 521 of the front case 52 is touched by the finger or the like, a change in electrostatic capacity is transmitted to the electrode 551 via the primary conductive film 523, whereby the sensor portion 55 detects that the front case 52 has been touched. Further, when the peripheral portion 531 of the rear case 53 is touched by the finger or the like, a change in electrostatic capacity is transmitted from the secondary conductive film 533 to the electrode 551 via the primary conductive film 523, whereby the sensor portion 55 detects that the rear case 53 has been touched. Namely, in this embodiment, the front case 52, the rear case 53, the primary conductive films 523, the secondary conductive films 533 and the sensor portions 55 configure a touch switch.

Thus, as has been described heretofore, according to the electronic apparatus 50 according to the second embodiment, the plurality of sensor portions 55 are arranged piece by piece along the circumferential direction of the front case 52, and the plurality of primary conductive films 523 are formed on the inner surface of the peripheral portion 521 of the front case 52 so as to correspond individually to the plurality of sensor portions 55. Therefore, a plurality of electrically independent touch switches can be provided within the single electronic apparatus 50.

In addition, since the secondary conductive film 533 which is electrically connected to the primary conductive film 523 is formed on the inner surface of the peripheral portion 531 of the rear case 53, a touch to the rear case 53 can also be detected with the single sensor portion 55.

Figure 7:
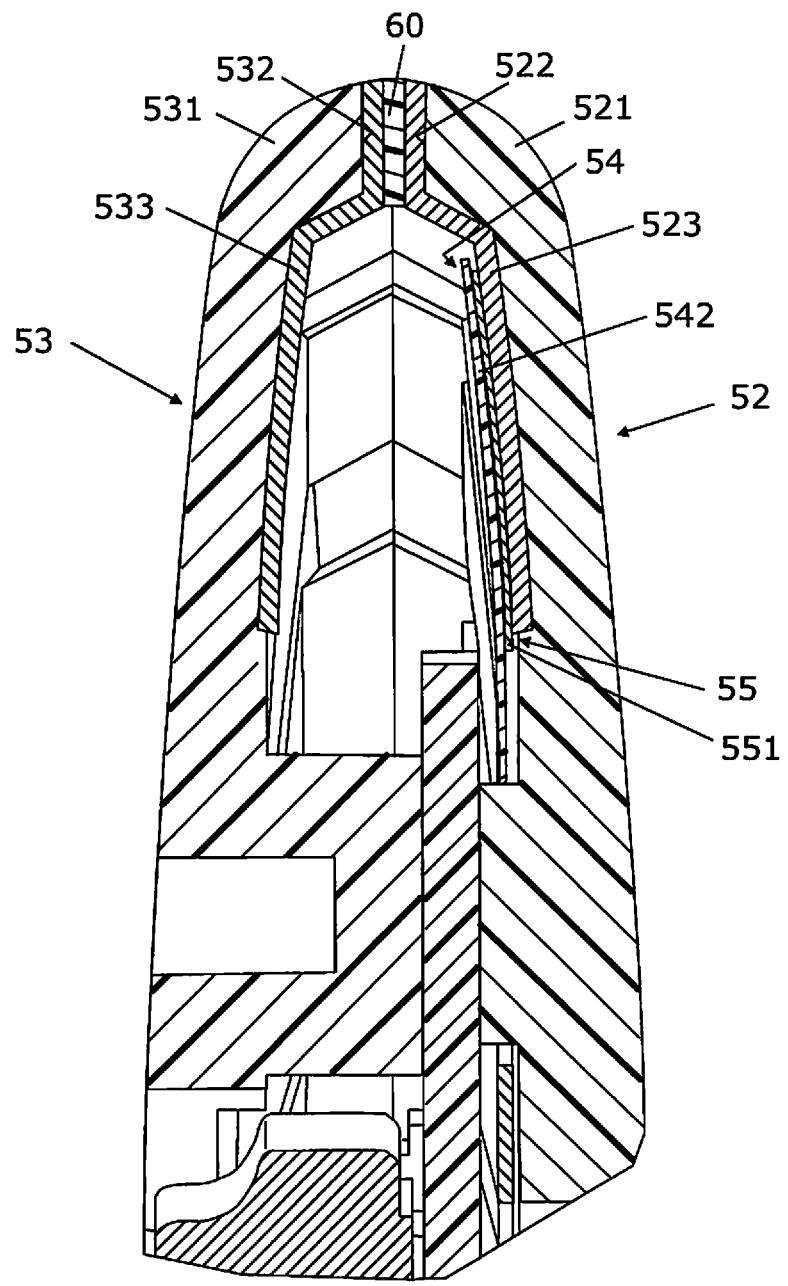
FIG. 7 is a sectional view depicting a modified example to the electronic apparatus shown in FIG. 6.

As is shown in FIG. 7, by interposing a conductive rubber 60 at the abutment portion (the electrically connected portion) between the primary conductive film 523 and the secondary conductive film 533, the electrically connected state between the primary conductive film 523 and the secondary conductive film 533 can be ensured further. With a view to ensuring the electrically connected state between the primary conductive film 523 and the secondary conductive film, it is desirable that the conductive rubber 60 is in a compressed state at all times after assemblage so as to bias the primary conductive film 523 and the secondary conductive film 533 in a direction in which they are separated from each other.

Third Embodiment

In the second embodiment, the peripheral portions 521, 531 of the front case 52 and the rear case 53 have been described as being brought into engagement with each other via the primary conductive films 523 and the secondary conductive films 533. In a third embodiment, however, a front case and a rear case will be described as being brought into engagement with each other via an interposed member at peripheral portions thereof. In the following description, like reference numerals will be given to like portions to those of the second embodiment, and the description thereof will be omitted.

Figure 8:
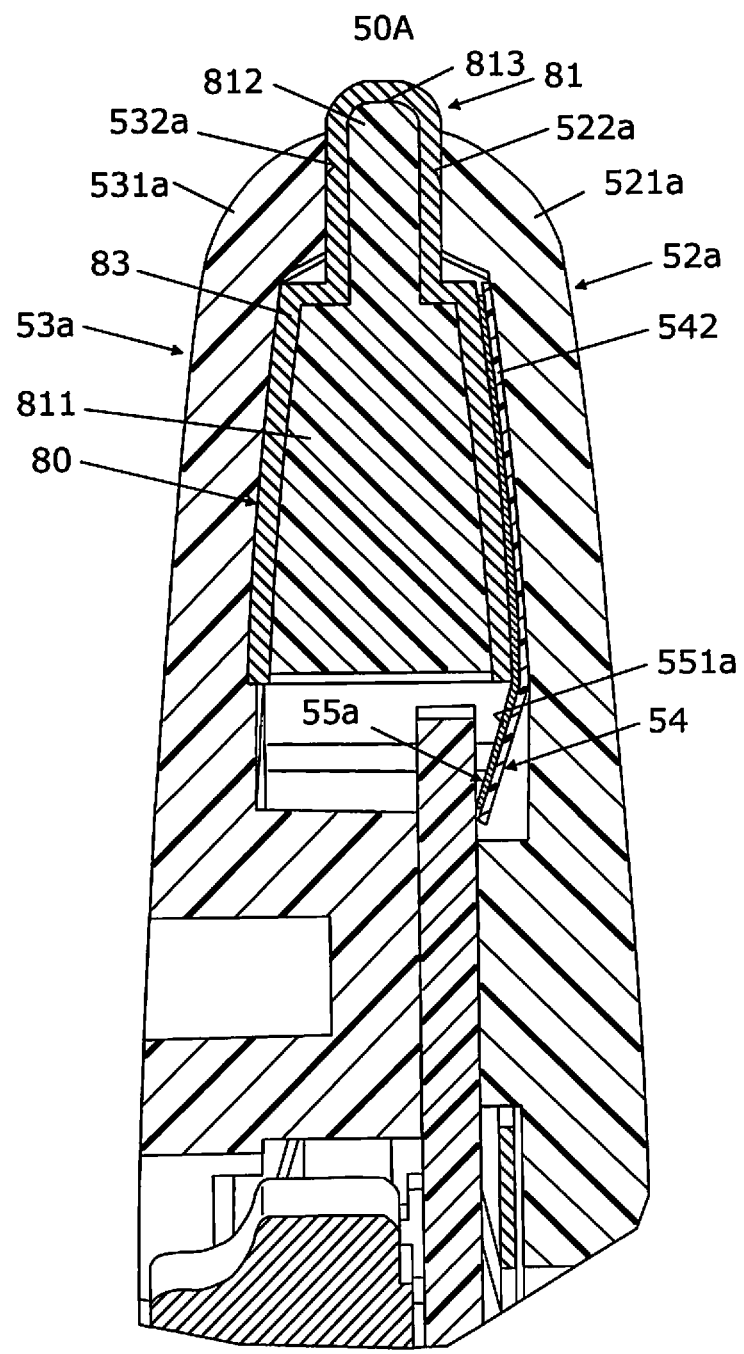
FIG. 8 is a sectional view depicting the configuration of a main part of an electronic apparatus according to a third embodiment of the invention.

FIG. 8 is a sectional view depicting the configuration of a main part of an electronic apparatus 50A according to the third embodiment.

As is shown in FIG. 8, in an electronic apparatus 50A of the third embodiment, no conductive film is formed between a front case 52a and a rear case 53a. In addition, an electrode 551a of a sensor portion 55a is formed on a rear surface of each extended portion 542 of a substrate 54.

An annular interposed member 80 is interposed between a peripheral portion 521a of the front case 52a and a peripheral portion 531a of the rear case 53a. The interposed member 80 is held by the peripheral portion 521a of the front case 52a and the peripheral portion 531a of the rear case 53a along the full circumference thereof.

Figure 9:
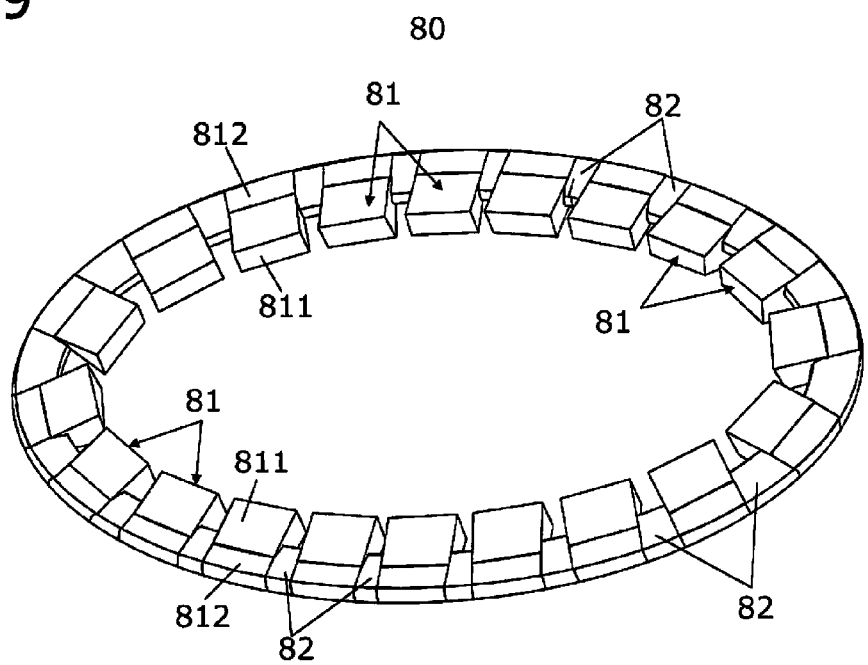
FIG. 9 is a perspective view depicting a schematic configuration of an interposed member used in the electronic apparatus shown in FIG. 8.

FIG. 9 is a perspective view depicting a schematic configuration of the interposed member 80. The interposed member 80 has a plurality of electrically connecting portions 81 and a plurality of connecting portions 82 which connect the electrically connecting portions 81 together. The connecting portions 82 are not conductive and make the individual electrically connecting portions electrically independent.

The electrically connecting portion 81 has a main body portion 811 and an exposed portion 812 which is positioned further radially outwards than the main body portion and part of which is exposed towards the outside. The main body portion 811 and the exposed position 812 are formed integrally from a resin or the like. A continuous conductive film (an interposed member conductive portion) 83 is established over front surfaces of the main body portion 811 and the exposed portion 812. By doing so, the conductive film 83 is formed to extend from a portion of the front surface of the interposed member 80 which is brought into abutment with a sensor portion 55a to a portion which corresponds to a position where the peripheral portion 521a of the front case 52a and the peripheral portion 531a of the rear case 53a face each other. This conductive film 83 is also formed by any of treatments including plating, metallizing, carbon printing and conductive film affixing treatments.

The main body portion 811 is positioned further radially inwards than distal end faces 522a, 532a of the peripheral portions 521a, 531a of the front case 52a and the rear case 53a. The conductive film 83 which covers a rear surface side of the main body portion 811 is in abutment with an inner surface of the rear case 53a. On the other hand, the conductive film 83 which covers a front surface side of the main body portion 811 is in abutment with an electrode 551a provided on a rear surface of the extended portion 542 of the substrate 54.

The exposed portion 812 is held by the distal end face 522a of the peripheral portion 521a of the front case 52a and the distal end face 532a of the peripheral portion 531a of the rear case 53a. An exposed surface 813 at a distal end portion of the exposed portion 812 projects further radially outwards than the front case 52a and the rear case 53a. By doing so, the conductive film 83 which covers the exposed surface 813 is also allowed to project outwards, whereby the conductive film 83 is made easier to be touched. As long as it can be touched by part of the human body, the exposed surface 813 does not have to project from the front case 52a and the rear case 53a. Specifically speaking, the exposed surface 813 may be disposed so as to be flush with external surfaces of the front case 52a and the rear case 53a. Alternatively, the exposed surface 813 may be disposed in a position which lies radially deeper than the external surfaces of the cases as long as the exposed surface 813 can still be touched by part of the human body.

Then, when the peripheral portion 521a of the front case 52a or the peripheral portion 531a of the rear case 53a is touched by the finger or the like, a change in electrostatic capacity is transmitted to the electrode 551a via the conductive film 83, whereby the sensor portion 55a detects that the front case 52a or the rear case 53a has been touched. Further, even in the event that the conductive film 83 which covers the distal end portion of the exposed portion 812 is touched by the finger or the like, a change in electrostatic capacity is transmitted to the electrode 551a via the conductive film 83, whereby the sensor portion 55a detects that the front case 52a or the rear case 53a has been touched. Namely, in this embodiment, the front case 52a, the rear case 53a, the interposed member 80, the conductive films 83 and sensor portions 55a configure a touch switch.

Thus, as has been described heretofore, according to the electronic apparatus 50A of the third embodiment, the conductive film 83, which is electrically connected to the electrode 551a, is formed on the front surface of the interposed member 80 which is in abutment with the electrode 551a of the sensor portion 55a. Therefore, the electrode 551a and an end face of the front case 52a (and the rear case 53a) can be brought into contact with each other by the conductive film 83, thereby making it possible to enhance the sensitivity of each of the touch switches along an end face of the electronic apparatus 50A.

In addition, since the necessity of affixing the sensor portion to the front case by curving the flexible substrate at the time of assemblage of the electronic apparatus, which is the case with the related art, is obviated, the assemblage itself can be facilitated.

The plurality of sensor portions 55a are arranged individually along the circumferential direction of the front case 52a, and the plurality of conductive films 83 are formed on the interposed member 80 so as to correspond individually to the plurality of sensor portions 55a. Therefore, a plurality of electrically independent touch switches can be provided in the single electronic apparatus 50A.

The conductive film 83 is formed on the front surface of the interposed member 80 so as to extend continuously to the exposed surface 813. Therefore, in the event that a lateral end surface or the exposed surface 813 of the electronic apparatus 50A is touched, a change in electrostatic capacity can be transmitted to the electrode 551a via the conductive film 83. Namely, the change in electrostatic capacity can be transmitted to the sensor portion 55a without involvement of the front case 52a or the rear case 53a. Therefore, whether or not the lateral end surface of the electronic apparatus 50A is touched can be detected in an ensured fashion.

While the embodiment has been described as the interposed member 80 being formed into the annular shape, the interposed member does not have to be annular and hence may be interrupted in an intermediate position or positions along the full circumference thereof.

Figure 10:
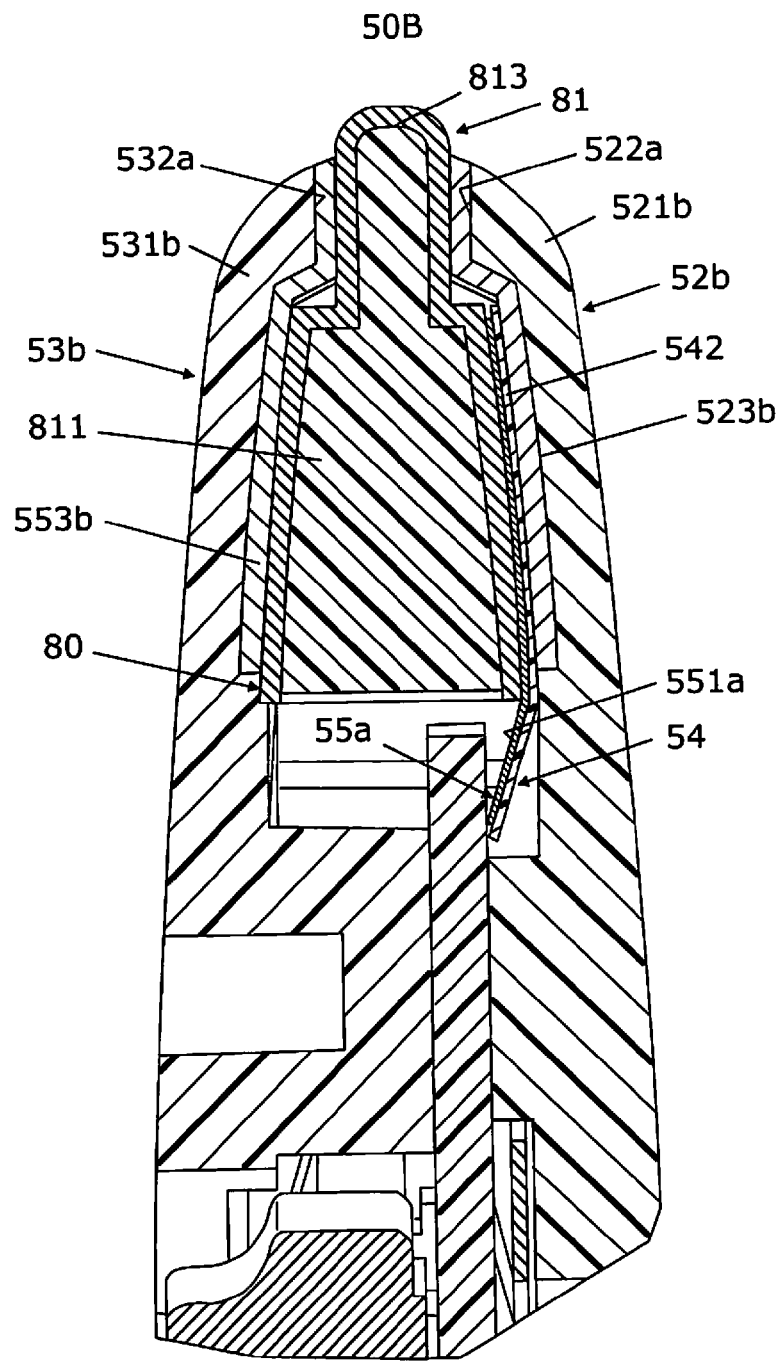
FIG. 10 is a sectional view depicting a modified example to the electronic apparatus shown in FIG. 8.

As with an electronic apparatus 50B shown in FIG. 10, conductive films (case conductive portion) 523b, 533b, which are brought into abutment with a conductive film 83 of an interposed member 80 for electrical connection, can be formed on inner surfaces of peripheral portions 521b, 531b of a front case 52b and a rear case 53b. The conductive films 523b, 531b may be formed on an inner surface of at least one of the peripheral portions 521b, 531b of the front case 52b and the rear case 53b which extends as far as a position where one faces the other or vice versa. By doing so, a higher electrical conductivity can be ensured, thereby making it possible to enhance the sensitivity of the touch sensors.

The case conductive portion may only have to be formed on at least one of the front case 52b and the rear case 53b.

In the embodiments, while the lighting systems have been described as the electronic apparatuses 1, 50, 50A and 50B for clarity of the invention, any electronic apparatus will do as long as the electronic apparatus incorporates a touch switch.

In addition, while the first to third embodiments have been described as the primary conductive portion, the secondary conductive portion, the interposed member conductive portion, and the case conductive portion each being formed into a conductive film using any of treatments including plating, metallizing, carbon printing, and conductive film affixing treatments. However, each of the primary conductive portion, the secondary conductive portion, the interposed member conductive portion, and the case conductive portion may be formed into a conductive layer using an overmolding process.

Specifically, when the front case 52 and the primary conductive portion are formed by the overmolding process and the rear case 53 and the secondary conductive portion are formed by the overmolding process, the primary conductive portion and the secondary conductive potion are each formed integrally with the front case 52 and the rear case 53 respectively as a conductive layer.

In addition, when the front case 52b and the case conductive portion, and the rear case 53b and the case conductive portion are each formed using the overmolding process, each of the case conductive portions is formed integrally with the cases 52b and 53b respectively as a conductive layer.

Further, when the interposed member conductive portion and the interposed member 80 are formed using the overmolding process, the interposed member conductive portion is formed integrally with the interposed member 80 as a conductive layer.

Fourth Embodiment

The internal configurations of the cases of the first to third embodiments may take a configuration that will be described herebelow. In this embodiment, a digital camera is taken as an example of an electronic apparatus, and the illustration of a conductive film will be omitted.

Figure 11:
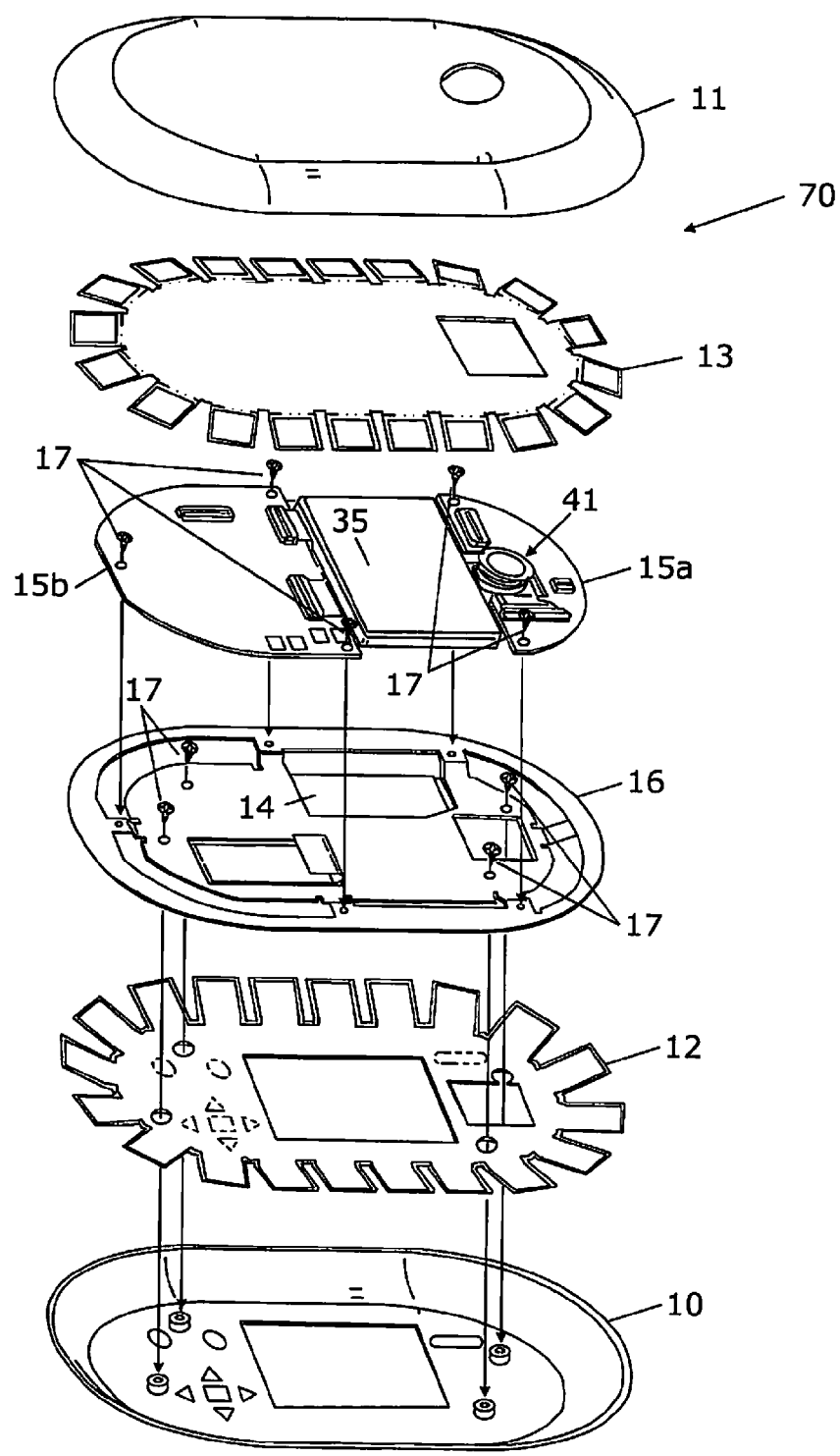
FIG. 11 is an exploded perspective view depicting an internal construction of an electronic apparatus according to a fourth embodiment of the invention.

FIG. 11 is an exploded perspective view of an electronic apparatus 70 which is a digital camera with its image pickup lens oriented upwards. As is shown in FIG. 11, the electronic apparatus 70 is such that an upper front case 11 and a lower rear case 10 are fitted together, and included in an interior thereof are a front flexible substrate 13, two main substrates 15a, 15b, a battery storage case 35, a lens unit 41, a metallic support member 16, a display unit 14 and a rear flexible substrate 12.

The rear case 10 is a resin case. A rectangular opening portion is provided in a central plane portion of the rear case 10 so as to visualize a display screen of the display unit 14 which is a monitor. Four cylindrical bosses are provided on the central plane portion of the rear case 10 for fastening the metallic support member 16 with machine screws. A transparent plate is fitted in the opening portion. The rear flexible substrate 12 is attached to an inside of the rear case 10 to lie all over the whole surface thereof using a fixing method such as an adhesive or a pressure sensitive adhesive double coated tape, which is not shown.

The metallic support member 16 is a plate-like member which is produced of a metallic conductive material and forms a reference ground potential of a circuit in the electronic apparatus 70. The metallic support member 16 is supported on distal planes of the four fastening bosses provided on the rear case 10. Then, the metallic support member 16 is fixed to the rear case 10 by screwing machine screws 17 in fastening holes. Five planes are provided on the metallic support member 16 for supporting the main substrates 15a, 15b.

The two main substrates 15a, 15b are circuit boards on which various types of electronic components are mounted to configure required circuits. The main substrates 15a, 15b are fixed to the metallic support member 16 by screwing machine screws 17 in fastening holes provided in the main substrates 15a, 15b. Namely, the main substrates 15a, 15b are incorporated in the rear case 10 via the metallic support member 16. Copper exposed portions are formed on the periphery of the five fastening holes provided in the main substrates 15a, 15b for connection to ground wires of the main substrates 15a, 15b. The ground wires of the main substrates 15a, 15b are electrically connected to the metallic support member 16 by being fastened in the five fastening holes with conductive machine screws 17. The other constituent components such as the battery storage case 35, the display unit 14 and the lens unit 41 are also incorporated in the rear case 10 via the metallic support member 16.

The front flexible substrate 13 is attached to an inside of the front case 11 to lie all over the whole surface thereof using a fixing method such as an adhesive or a pressure sensitive adhesive double coated tape, which is not shown. Then, the incorporation of the constituent components in the electronic apparatus 70 is completed by the front case 11 being fitted on the rear case 10 in which the aforesaid respective constituent components are incorporated.

Figure 12:
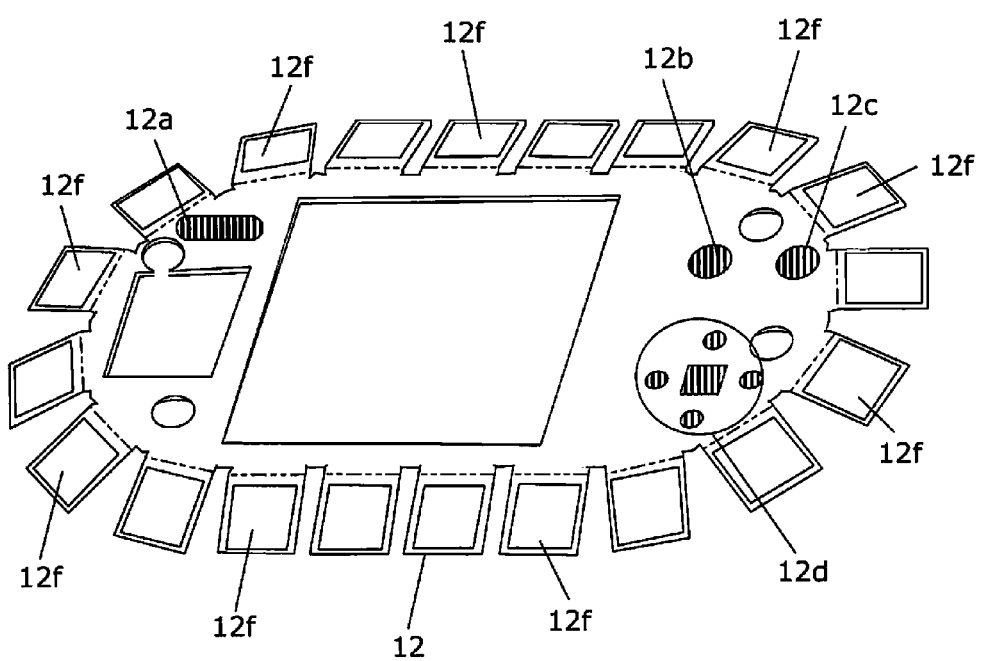
FIG. 12 is a perspective view depicting electrostatic sensor pads of a rear flexible substrate used in the electronic apparatus shown in FIG. 11.
Figure 13:
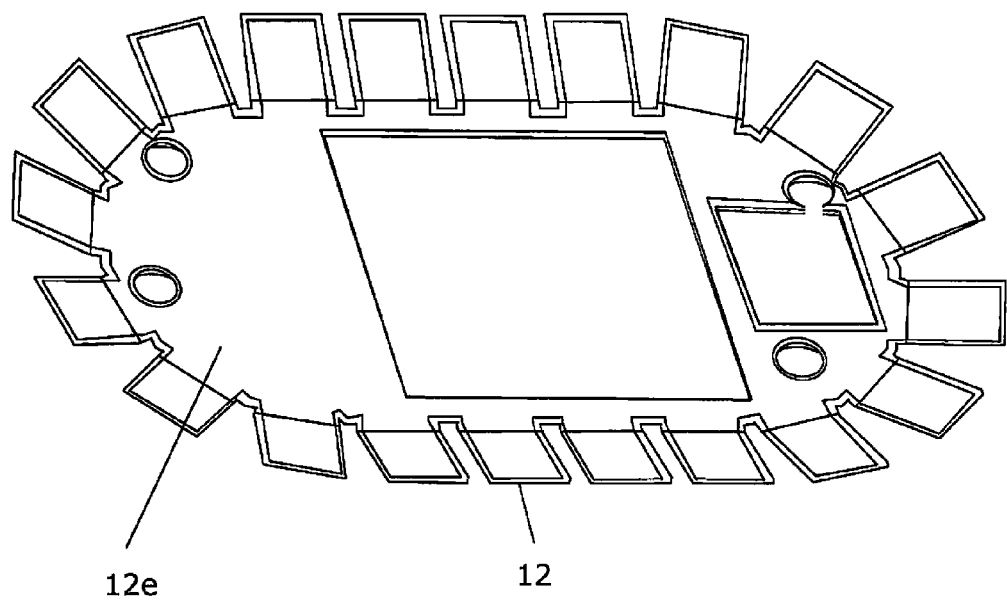
FIG. 13 is a perspective view depicting a shield surface of the rear flexible substrate used in the electronic apparatus shown in FIG. 11.

Next, the rear flexible substrate 12 will be described which has electrostatic sensor pad portions which constitute an input means of the electronic apparatus 70. FIG. 12 is a perspective view of the rear flexible substrate 12 with a side oriented upwards where the electrostatic sensor pad portions are provided. FIG. 13 is a perspective view of the rear flexible substrate 12 with the side where the electrostatic sensor pads are provided oriented downwards and a side where a shield is formed oriented upwards. The front flexible substrate 13 which is provided on the inside of the front case 11 to lie all over the surface thereof is the same as the rear flexible substrate 12, which will be described below, and therefore, the description of the former will be omitted herein.

The rear flexible substrate 12 is a substrate in which electrostatic sensor pads and a wiring portion are provided on one side of a film base material and a copper foil pattern functioning as a shield layer is provided on the other side thereof. As is shown in FIG. 12, electrostatic sensor pads 12*a*, 12*b*, 12*c*, 12*d* are provided in predetermined positions on the electrostatic sensor pad side of the rear flexible substrate 12. In addition, as is shown in FIG. 12, electrostatic sensor pads 12*f* which are used for other user interfaces are provided at a comb-teeth-like portion on the periphery of the rear flexible substrate 12.

In addition, as is shown in FIG. 13, a copper foil pattern 12*e* which functions as a shield layer is disposed on the shield side of the rear flexible substrate 12 so as to match an external shape thereof. Although the copper foil pattern 12*e* may be exposed, it is desirable that an insulation coating is applied to the copper foil pattern 12*e*. This copper foil pattern 12*e*, which is disposed over the whole surface of the shield side of the rear flexible substrate 12, is connected to the ground wires of the main substrates 15*a*, 15*b* via connectors at a circuit leading portion and a terminal portion, which are not shown. The copper foil pattern 12*e* is disposed on the shield side of the rear flexible substrate 12 so as to match the external shape thereof, whereby an interior of the rear case 10 is shielded, thereby making it possible to prevent the emission of unnecessary radiation noise emitted from the main substrates 15*a*, 15*b* to the outside of the electronic apparatus 70.

Respective signal lines of the electrostatic sensor pads of the rear flexible substrate 12 and the front flexible substrate 13 are connected to an electrostatic sensor processing portion mounted on the main substrates 15*a*, 15*b* via connectors at the circuit leading portions or terminal portions, which are not shown. Because of this, by the operator touching a touch key with his or her finger, the electrostatic sensor processing portion detects a change in electrostatic capacity between an electrode which corresponds to the electrostatic sensor pad position in an interior of the touch key so touched and GND, whereby the electrostatic sensor processing portion can detect that the touch key has been touched.

Figure 14:
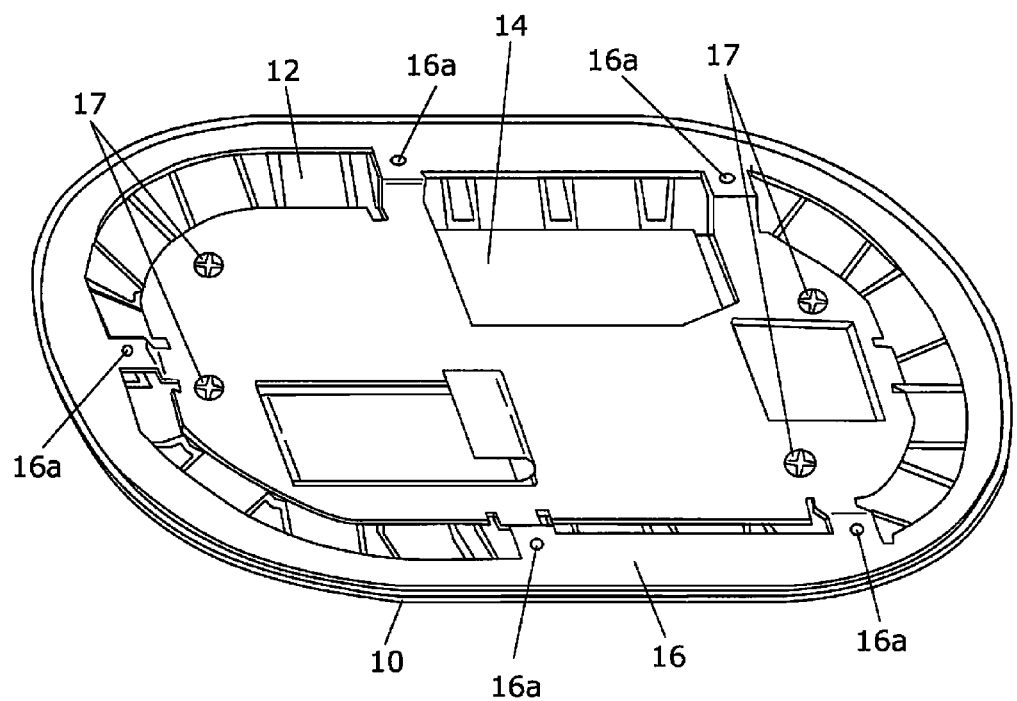
FIG. 14 is a perspective view depicting the installation of a display unit and a metallic support member of the electronic apparatus shown in FIG. 11.

Next, the metallic support member 16 will be described which fixes the main substrates 15*a*, 15*b* in the interior of the electronic apparatus 70. FIG. 14 is a perspective view depicting a state in which the display unit 14 and the metallic support member 16 are incorporated in the rear case 10 in an interior of which the rear flexible substrate 12 is installed.

The metallic support member 16 is produced of a metallic conductive material and is supported on the planes of the four fastening bosses provided in the rear case 10 as described above. As is shown in FIG. 14, the metallic support member 16 is fixed to the rear case 10 by screwing the machine screws 17 in the fastening holes formed in the metallic support member 16. The display unit 14 is mounted on the metallic support member 16 side in advance and is fixed to the rear case 10 in an ensured fashion by the metallic support member 16 being attached to the rear case 10. In addition, the five planes are provided on the metallic support member 16 for supporting the main substrates 15*a*, 15*b*. Then, as is shown in FIG. 11, the main substrates 15*a*, 15*b* are fixed to the metallic support member 16 by screwing machine screws 17 which are inserted in fastening holes formed in the main substrates 15*a*, 15*b* into machine screw holes 16*a*.

Figure 15:
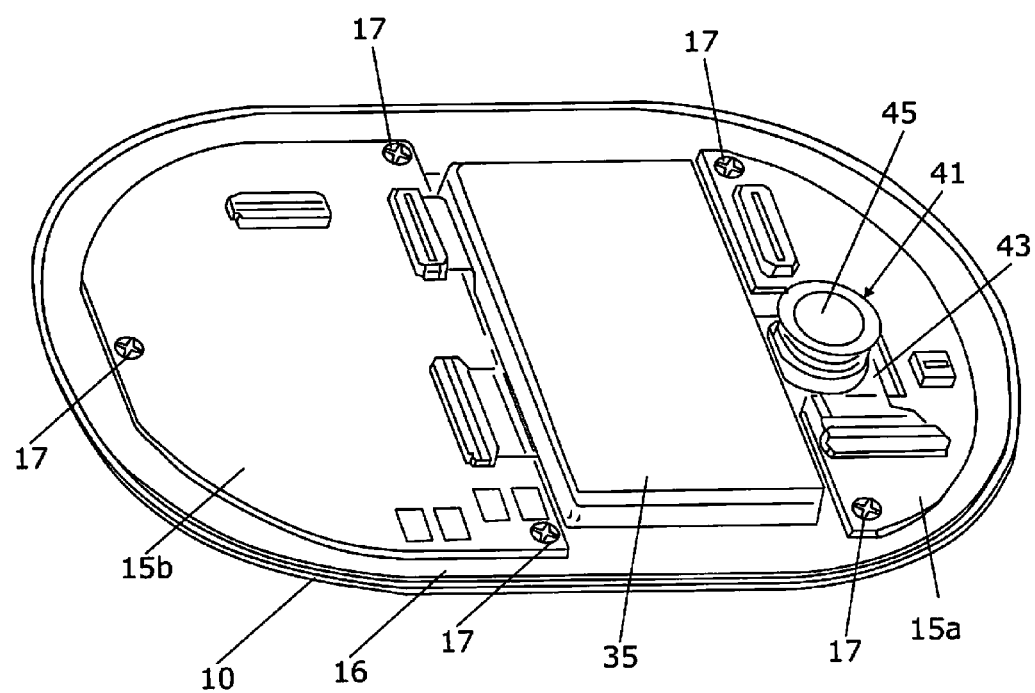
FIG. 15 is a perspective view depicting the installation of a main substrate of the electronic apparatus shown in FIG. 11.

Next, the main substrates 15*a*, 15*b* will be described. FIG. 15 is a perspective view depicting a state in which the metallic support member 16 and the main substrates 15*a*, 15*b* are incorporated in the rear case 10 in the interior of which the rear flexible substrate 12 is mounted.

The main substrate 15*a* has a semicircular shape and has a U-shaped cutout in the center thereof. The lens unit 41 is provided in the cutout. The lens unit 41 includes an image pickup lens at an upper portion and an image pickup element 43 at a lower portion thereof. The battery storage case 35 is disposed on a left-hand side of the main substrate 15*a*, and the semicircular main substrate 15*b* is disposed to the left of the main substrate 15*a* so as to hold the battery storage portion 35 therebetween.

Incorporated in the main substrates 15*a*, 15*b* are circuit components including an image processing unit for processing an image picked up, a control unit for controlling an operation of the camera as of switching modes of the camera between an image pickup mode and an image reproducing mode, a storage unit for reserving the image picked up and an electrostatic sensor processing unit for detecting an input. Then, as has been described before, the main substrates 15*a*, 15*b* are incorporated in the interior of the rear case 10 in such a state that they are mounted on the metallic support member 16. In addition, the battery storage case 35, the display unit 14 and the lens unit 41 are also incorporated in the interior of the rear case 10 via the metallic support member 16.

Figure 16:
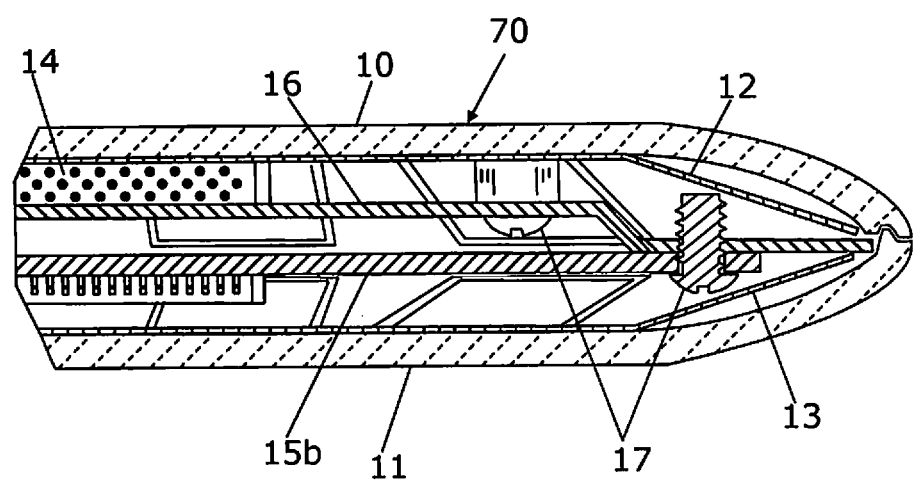
FIG. 16 is a sectional view depicting the configuration of a main part of the electronic apparatus shown in FIG. 11.

Next, a countermeasure against static electricity adopted in the electronic apparatus 70 of this embodiment will be described. FIG. 16 is a sectional view depicting the configuration of a main part of the electronic apparatus 70.

As is shown in FIG. 16, the metallic support member 16 is disposed so as to extend as far as near the fitting portion which lies along circumferential edges of the front case 11 and the rear case 10 together with the rear flexible substrate 12 and the front flexible substrate 13 in the interior of the front case 11 and the rear case 10 which are fitted together along circumferential edge portions thereof.

In addition, the metallic support member 16 is fixed to the rear case 10 by being fastened thereto with machine screws 17, and as is shown in FIG. 15, the metallic substrate 16 is fixed to the rear case 10 by fastening the main substrate 15*b* thereto with machine screws 17. In addition, the metallic support member 16 functions as a ground for a housing made up of the front and rear cases 11, 10.

By doing so, in the event that static electricity is generated in or applied to the electronic apparatus 70, since conductivity is interrupted on front surfaces of the cases by the flexible substrates which reside in the interior of the cases, the static electricity is prevented from entering the electronic apparatus 70 and is allowed to escape in such a way as to be conducted to the metallic support member 16 which is a conductive material lying near the fitting portion of the front case 11 and the rear case 10 and which functions as the ground of the housing. Consequently, the application of static electricity to electronic components mounted on the main substrates 15a, 15b can be prevented, thereby making it possible to prevent the malfunction of and damage to the electronic apparatus 70.

Thus, according to the electronic apparatus 70 of this embodiment, the rear flexible substrate 12 and the front flexible substrate 13 are placed so as to cover the inner surfaces of the rear case 10 and the front case 11, respectively. In addition, the metallic support member 16 is provided in the interior of the electronic apparatus 70 as a support member. By adopting this configuration, the main substrates 15a, 15b, the lens unit 41, the battery storage case 35 and the like can be fixed, thereby making it possible to enhance the packaging density of the electronic apparatus 70. Moreover, static electricity that is applied when the electronic apparatus 70 is operated by a user is allowed to be conducted to the metallic support member 16 which is the conductive material lying near the housing for escape. By adopting this configuration, static electricity can be prevented from being conducted to the electronic components, and therefore, the malfunction of and damage to the electronic apparatus 70 can be prevented.

In addition, according to the electronic apparatus 70 of this embodiment, the copper foil patterns 12e are disposed on the inner surfaces of the rear flexible substrate 12 and the front flexible substrate 13 so as to extend to match the external shapes thereof. Then, the copper foil patterns 12e are connected to the ground wires of the main substrates 15a, 15b to form the shield layers, whereby the interior of the electronic apparatus 70 can be surrounded to be shield by the shield layers so formed. By doing so, although the electronic apparatus 70 is the case made of the non-conductive material such as the resin, the emission of unnecessary radiation noise to an outside of the apparatus that is emitted from the interior of the electronic apparatus 70 can be prevented by placing the flexible substrates having the aforesaid shield layers on the insides of the cases so as to cover them entirely.

Then, the shield layers on the flexible substrates of the electronic apparatus 70 of this embodiment are formed by the copper foils on the flexible substrates for the touch sensors, whereby the necessity of providing an exclusive shield member for preventing the emission of unnecessary radiation noise of the electronic apparatus 70 to the outside of the apparatus is obviated, thereby making it possible to reduce the number of components and the production costs.

Further, according to the electronic apparatus 70 of this embodiment, the main substrates 15a, 15b and the like are allowed to be mounted on the metallic support member 16 which is fastened to the rear case 10 with the machine screws, thereby making it possible to enhance the packaging properties of the circuit components into the interior of the electronic apparatus 70.

In addition, in the electronic apparatus 70 of this embodiment, the metallic support member 16 constitutes the support member for the main substrates 15a, 15b and the like and is electrically connected to the ground wires of the main substrates 15a, 15b with the machine screws 17. Because of this, the metallic support member 16 functions as the ground for the casing of the electronic apparatus 70.

The invention is not limited to the embodiments that have been described heretofore and hence can be modified variously without departing from the spirit and scope thereof in the stages of carrying out the invention. In carrying out the invention, the functions that are executed in the aforesaid embodiments may be combined in an appropriate fashion as much as possible. Various stages are involved in the embodiments above, and various inventions can be extracted by combining appropriately the plurality of constituent features disclosed. For example, in the event that the required advantage can be obtained even when some of all the constituent features are deleted, the configuration resulting from the deletion of such constituent features can be extracted as an invention.

What is claimed is:

1. An electronic apparatus comprising:
    a front case;
    a rear case whose peripheral portion is brought into engagement with a peripheral portion of the front case; and
    an electrostatic capacity type sensor portion which is encompassed by the front case and the rear case,
    wherein a primary conductive portion is formed on part of an inner surface of the peripheral portion of one of the cases of the front case and the rear case, the primary conductive portion extends as far as an engagement portion where the front case is brought into engagement with the rear case, and the primary conductive portion is energized by being brought into abutment with the sensor portion, and
    wherein the electronic apparatus comprises a touch switch that detects a change in electrostatic capacity, and the touch switch comprises the primary conductive portion and the sensor portion.

2. The electronic apparatus as set forth in claim 1, wherein the sensor portion includes a plurality of sensors which are arranged individually along a circumferential direction of the one of the cases, and wherein the primary conductive portion includes a plurality of conductive films which are formed on the inner surface of the one of the cases so as to correspond individually to the plurality of sensors of the sensor portion.

3. The electronic apparatus as set forth in claim 1, wherein a secondary conductive portion which is electrically connected to the primary conductive portion is formed on part of an inner surface of the peripheral portion of the other case of the front case and the rear case, and the secondary conductive portion extends as far as the engagement portion.

4. The electronic apparatus as set forth in claim 3, wherein a conductive rubber is interposed in at least one of an electrically connecting portion between the primary conductive portion and the secondary conductive portion and an electrically connecting portion between the primary conductive portion and the sensor portion.

5. The electronic apparatus as set forth in claim 1, wherein the front case and the rear case are made from a resin, and the apparatus further comprises:
    a plate-like metallic support member which is accommodated between the front case and the rear case and fixed to either the front case or the rear case, and which forms a reference ground potential of the electronic apparatus;
    a circuit board which is fixed to the metallic support member; and
    two flexible substrates which are disposed so as to be closely attached to inner surfaces of the front case and the rear case, respectively, wherein one of the flexible substrates has an electrostatic sensor pad, a wiring portion, and a shield layer which is electrically connected to the metallic support member, and the other of the flexible substrates has at least a shield layer.

\* \* \* \* \*